US010830799B1

(12) United States Patent
Lee (10) Patent No.: US 10,830,799 B1
(45) Date of Patent: Nov. 10, 2020

(54) TEMPERATURE AND $V_{GS}$ COMPENSATION FOR CURRENT SENSING USING $R_{dson}$ IN MOSFETS (71) Applicant: Alpha and Omega Semiconductor (Cayman) Ltd., Grand Cayman (KY)

(72) Inventor: Gilbert S. Z. Lee, Seongnam-si (KR)

(73) Assignee: Alpha and Omega Semiconductor (Cayman) Ltd., Grand Cayman (KY)

(*) Notice: Subject to any disclaimer, the term of this patent is extended or adjusted under 35 U.S.C. 154(b) by 0 days.

(21) Appl. No.: 16/510,726

(22) Filed: Jul. 12, 2019

(51) Int. Cl.
G05F 1/56 (2006.01)
G01R 19/32 (2006.01)
G01R 19/00 (2006.01)
G05F 3/16 (2006.01)

(52) U.S. Cl.
CPC .......... G01R 19/32 (2013.01); G01R 19/0084 (2013.01); G01R 19/0092 (2013.01); G05F 1/561 (2013.01); G05F 3/16 (2013.01)

(58) Field of Classification Search
CPC .............. H03K 17/145; H03K 3/011; H03K 2217/0027; G05F 1/561; G05F 3/16; G01R 19/0092; G01R 19/0084; G01R 19/32
See application file for complete search history.

(56) References Cited

U.S. PATENT DOCUMENTS

| | | | |
|---|---|---|---|
| 5,156,005 A | 10/1992 | Redlich | |
| 5,723,974 A * | 3/1998 | Gray | H02M 3/156 323/282 |
| 6,304,108 B1 * | 10/2001 | Inn | H03F 3/345 327/543 |
| 6,998,827 B2 * | 2/2006 | Gattavari | H02M 3/156 323/272 |
| 7,180,278 B2 * | 2/2007 | Tai | H02M 3/1588 323/277 |
| 7,224,199 B1 | 5/2007 | Kang | |
| 7,282,894 B2 * | 10/2007 | Oswald | G01R 19/0092 323/224 |
| 8,598,941 B2 * | 12/2013 | Bhattacharya | H03F 1/308 327/262 |
| 8,629,669 B2 * | 1/2014 | Tournatory | H02M 3/156 323/271 |
| 8,692,477 B1 | 4/2014 | Lee | |
| 9,106,075 B2 | 8/2015 | Tomas et al. | |
| 9,491,014 B1 | 11/2016 | Lee | |
| 9,853,548 B1 | 12/2017 | Zhang | |
| 10,063,146 B1 | 8/2018 | Lee | |
| 10,243,550 B2 * | 3/2019 | Nallamothu | G05F 1/561 |
| 2012/0139518 A1 | 6/2012 | Cleveland et al. | |
| 2012/0235652 A1 | 9/2012 | Sheng et al. | |

(Continued)

Primary Examiner — Thomas J. Hiltunen
(74) Attorney, Agent, or Firm — JDI Patent; Joshua D. Isenberg; Robert Pullman (57) ABSTRACT A power MOSFET Rdson compensation device comprising analog circuitry receives an input signal proportional to a voltage drop across a power MOSFET, one or more base reference voltages, a voltage-dependent reference voltage, and a temperature-dependent reference voltage. The analog circuitry is configured to produce an output current corresponding to the input signal with compensation for voltage and temperature variation of a drain-source on resistance of the power MOSFET.

10 Claims, 6 Drawing Sheets (56) References Cited

U.S. PATENT DOCUMENTS

| | | |
|---|---|---|
| 2014/0241414 A1 | 8/2014 | Reidl et al. |
| 2014/0268939 A1 | 9/2014 | Tomas et al. |
| 2014/0277802 A1 | 9/2014 | Tomas et al. |
| 2015/0255930 A1 | 9/2015 | Lee |
| 2015/0311780 A1 | 10/2015 | Tomas et al. |
| 2016/0049876 A1 | 2/2016 | Lee et al. |
| 2016/0109488 A1 | 4/2016 | Dearborn et al. |
| 2016/0259390 A1 | 9/2016 | Tomas et al. |
| 2017/0115725 A1 | 4/2017 | Luo |
| 2017/0331369 A1* | 11/2017 | Sugimoto ............. H02M 3/155 |
| 2017/0370875 A1* | 12/2017 | Ono ....................... H01L 23/34 |

* cited by examiner

TEMPERATURE AND $V_{GS}$ COMPENSATION FOR CURRENT SENSING USING $R_{dson}$ IN MOSFETS

FIELD OF THE INVENTION

Aspects of the present disclosure generally relate to current sensing in metal Oxide semiconductor field effect transistor (MOSFET) devices and more particularly to temperature and gate driving voltage ($V_{GS}$) compensation in MOSFETS that use the resistance across the MOSFET when in the on state ($R_{dson}$) for current sensing.

BACKGROUND OF THE INVENTION

In power systems for voltage regulation (VR) and current regulation (CR), the current information is one of important piece of information for output regulation and protection. Many power converter systems get the current information by calculating drop-out voltage generated by a current sensing resistor, e.g., a discrete resistor of known resistance, the DC resistance (DCR) of an inductor, or the $R_{dson}$ of a MOSFET.

A discrete resistor is accurate but requires additional cost and space and creates unwanted power loss. The DCR of an inductor does not require additional cost and space because it uses the parasitic DC resistance in the inductor coil but it has poor accuracy and high variation due to current flow distribution, temperature, aging of the inductor, etc.

$R_{dson}$ sensing of the MOSFET is the most energy efficient and economical current sensing method because there is no additional power loss and no need for expensive accurate devices or circuitry. However, $R_{dson}$ current sensing is dependent on several variable factors such as temperature, $V_{GS}$, operating current, process distribution, etc. Temperature and $V_{GS}$ variation are the main factors that affect the accuracy of $R_{dson}$ sensing. These factors have major effects on the current sensing accuracy when using $R_{dson}$. There is therefore a need to compensate for them.

Past methods for temperature compensation in $R_{dson}$ sensing have used digital processing based on a Look-up table (LUT) having experimental $R_{dson}$ Temperature coefficient (TCF) data in an assigned memory. This LUT method requires complicated digital controller circuitry to perform the compensation and a memory to store the LUT. Additionally, this method needs accurate LUT information, which is obtained by empirical evaluation and is only applicable to specified MOSFETs and must be listed in the LUT in advance. If a system uses a MOSFET that is not listed in the LUT the controller cannot apply proper compensation. Additionally, to accommodate different MOSFET types, TCF data for each type of MOSFET must be specified in the LUT. Compatibility for multiple different MOSFET types therefore depends on available memory. Further, LUT methods only compensate for $R_{dson}$ change with temperature and do not compensate the $R_{dson}$ change due to VGS change.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Structure

According to aspects of the present disclosure, a device implemented with analog circuitry may compensate for deviation in sensed current information due to variation in $R_{dson}$ due to temperature change as well as VGS change when $R_{dson}$ of a MOSFET is used for current sensing. The fundamental idea is to use the linear resistance characteristic of MOSFETs operating in the deep triode region. As it is generally understood by those skilled in the relevant art, a MOSFET is said to operate in three regions based on the condition of the inversion layer existing between the source and drain. These regions are commonly referred to as the cutoff, triode and saturation regions. In the cutoff region, the device is turned off and little to no current flows between source and drain if the gate-source voltage Vgs is below some threshold Vth for creating a conducting path between source and drain. Strictly speaking, there may be a small leakage current due to some of the more thermally energetic electrons at source flowing to the drain. In the saturation region, drain-source current Ids does not increase with increasing drain-source voltage Vds if the gate-source Vgs is greater than Vth and Vds is greater than or equal to Vds−Vth. In this region drain-source current Ids increases with increasing gate-source voltage Vgs.

The triode region is the operating region where the inversion region exists and current flows, but this region has begun to taper near the source. The potential requirement here is Vds<Vgs−Vth. Here, the drain-source current Ids has a parabolic relationship with the drain-source potential Vds.

The MOSFET operates as a switch in this region. The linear region of a MOSFET can be considered as a special portion of the triode region, referred to herein as the "deep triode region". Here, because of the very small value of the applied drain-source potential, there is an accurately linear relationship between Vds and Ids and the MOSFET behaves like a voltage dependent resistor. The potential condition for linear or "deep triode" region is Vds<<Vgs−Vth. By way of example, and not by way of limitation, Vds may be between about 1% and about 10% of Vgs−Vth in the deep triode region.

The compensation device compensates for the temperature variation of $R_{dson}$ based on predetermined linear ($1^{st}$ order) temperature coefficient (TC1) information. Moreover, the device also compensates for variation of $R_{dson}$ variation in voltage between a gate node and a source node (VGS) of the power MOSFET based on the known predetermined linear ($1^{st}$ order) VGS coefficient (VC1) information. The presently described compensation device presents a more compact device and easier method than previous attempts at compensation, which require accurate Analog-Digital Converter (ADC), complicated digital algorithms and memory for look-up tables.

Current sensing methods that use $R_{dson}$ (MOSFET on-resistance) sense the voltage drop between a MOSFET's drain and source, which is generated by the resistance of MOSFET to flow of current, $R_{dson}$. However, because $R_{dson}$ is variable to temperature and VGS the sensed dropout voltage ($V_{sen}$) changes with relation to the variation $R_{dson}$ as shown the below.

$$Rdson(T,VGS)=Rdson_0 \cdot (1+TC1 \cdot \Delta T - VC1 \cdot \Delta VGS) \quad \text{EQ. 1}$$

$$Vsen=Isen \cdot Rdson_0 \cdot (1+TC1 \cdot \Delta T - VC1 \cdot \Delta VGS) \quad \text{EQ. 2}$$

Where, $Rdson_0$ is the resistance across the power MOSFET in the absence of VGS change ($\Delta VGS$) and temperature change ($\Delta T$) and the power MOSFET's Rdson has a positive proportional coefficient (TC1, Linear temp coefficient) to temp and a negative proportional coefficient (VC1, linear VGS coefficient) to VGS. The voltage drop (Vsen) is the Rdson multiplied by the current flow (Isen), independent current to temperature and VGS, as well as at a reference temperature and VGS.

According to aspects of the present disclosure, the sensed voltage (Vsen) will be converted into a current, (Iin) by a trans-conductance amplifier ($Gm_{in}$) to generate compensation for variation in Rdson which results in the relationship shown below.

$$Iin=Gm_{in} \cdot Isen \cdot Rdson_0 \cdot (1+TC1 \cdot \Delta T - VC1 \cdot \Delta VGS) \quad \text{EQ. 3}$$

The key insight in the present disclosure is that compensation for variation in Rdson can be achieved using the linear response of MOSFETS operation in the deep triode region. For the compensation, EQ. 3 should be divided by $(1+TC1*\Delta T-VC1*\Delta VGS)$ to produce compensated output current (Iout) having a voltage dependent term $(1-VC1*\Delta VGS)$ and temperature dependent term $(1+TC1*\Delta T)$. Aspects of this disclosure relate to how to create a divider using MOSFET Rdson linearity characteristic of deep triode operation.

Figure 1:
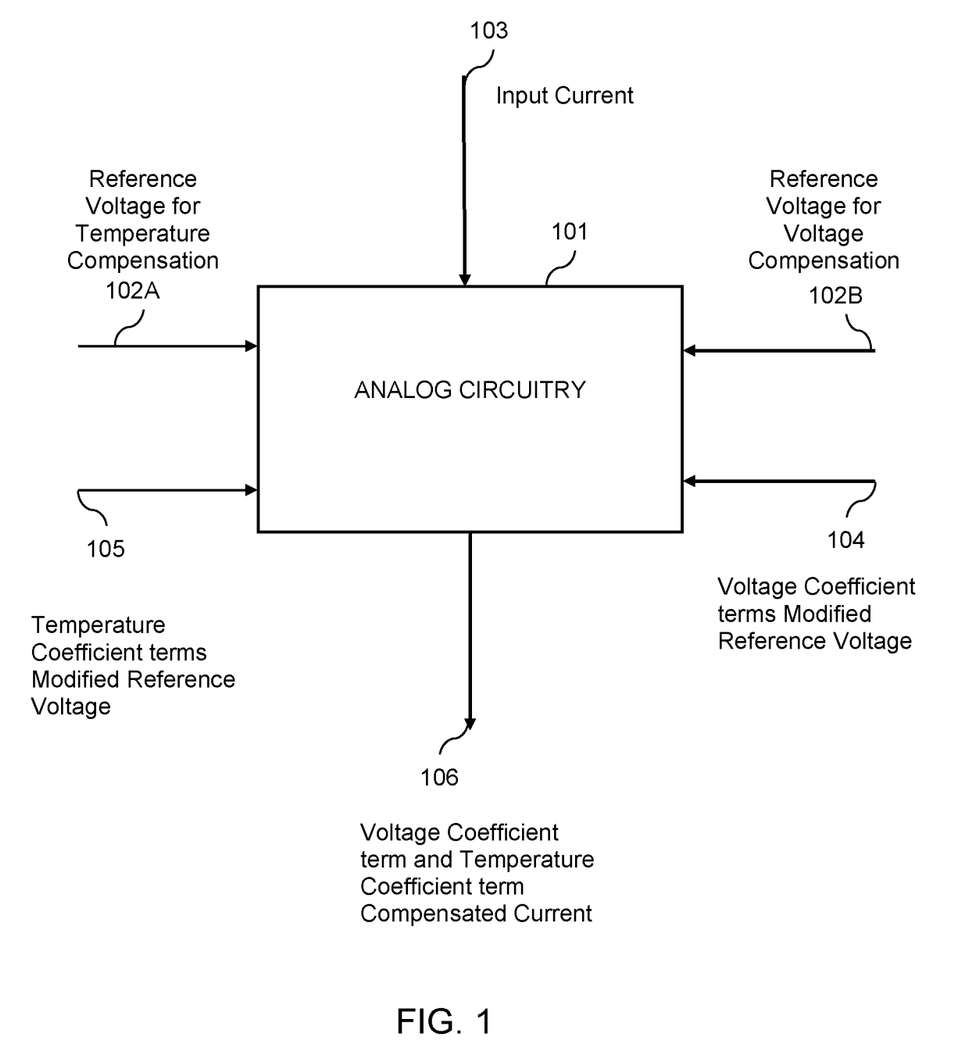
FIG. 1 is a block diagram of a compensation device according to aspects of the present disclosure.

The block diagram depicted in FIG. 1 illustrates an example of a power MOSFET compensation device 101 with inputs and outputs according to aspects of the present disclosure. As shown the device 101 includes analog circuitry that receives an input current (Iin) 103, one or more reference voltages, which may include a temperature compensation reference voltage 102A and a voltage compensation reference voltage 102B, a voltage dependence modified reference voltage 104 and a temperature dependence modified reference voltage 105. The power MOSFET compensation device 101 outputs an output current 106 that is proportional to the voltage drop across the power MOSFET divided by voltage coefficient terms and temperature coefficient compensation terms.

Figure 2A:
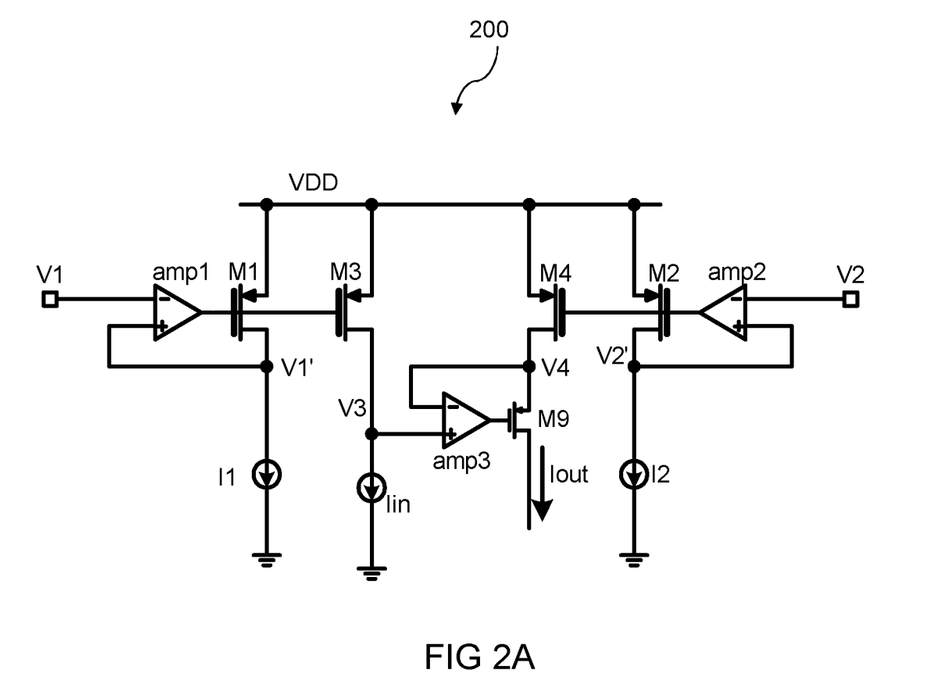
FIG. 2A is a simplified circuit diagram of a compensation device utilizing p-channel MOSFETs (PMOSFETS) according to aspects of the present disclosure.
Figure 2B:
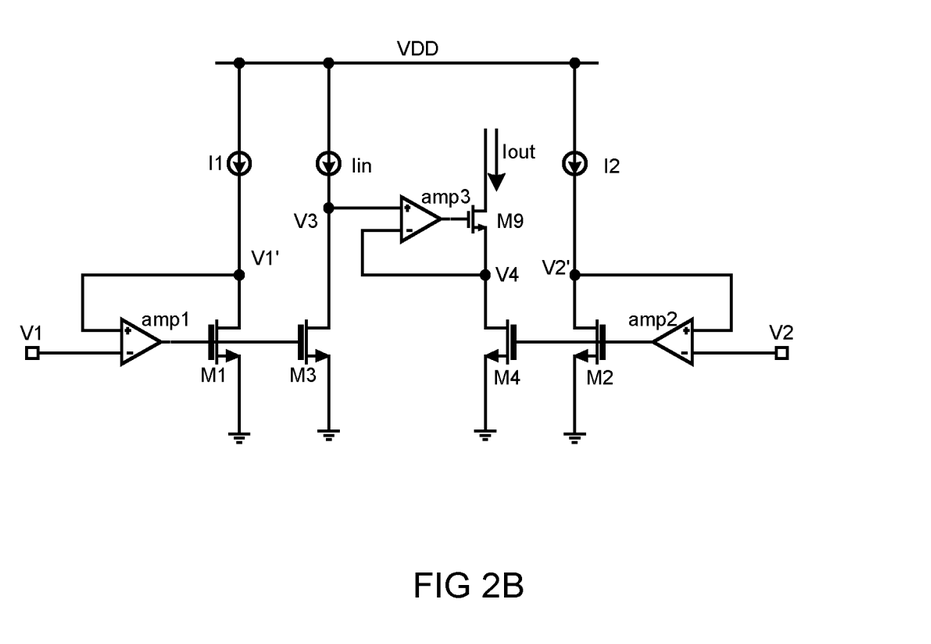
FIG. 2B is a complimentary simplified circuit diagram a compensation device utilizing n-channel MOSFETs (NMOSFETS) according to aspects of the present disclosure

FIG. 2A and FIG. 2B depict two examples of simplified $R_{dson}$ temperature and VGS compensation circuits that may be included in the analog circuitry of the power MOSFET compensation device 101. FIG. 2A illustrates a p-channel MOSFET (PMOSFET) configuration and FIG. 2B depicts an N-channel MOSFET (NMOSFET) configuration. The simplified compensation circuit shown in FIG. 2A includes four p-channel enhancement mode MOSFETs M1, M2, M3, and M4 in this example, the respective body regions of all four of these PMOSFETs connected to VDD. In the NMOSFET configuration shown in FIG. 2B, by contrast, NMOSFETs M1, M2, M3, and M4 have their respective body regions connected to ground. Whether they are PMOSFETS or NMOSFETS, the four MOSFETs M1, M2, M3, and M4 are configured to operate in the deep triode region. The source node of each of the MOSFETs is conductively coupled (e.g., by a wire, metal trace, etc.) to a reference voltage rail VDD. The gate nodes of two of the MOSFETs M1, M3 are conductively coupled to one amplifier amp1 while the gate nodes the other two MOSFETS M2, M4 are conductively coupled to a second amplifier amp2. Inputs of amplifiers amp1 and amp2 are coupled to reference voltage sources V1 and V2 respectively, which provide corresponding reference voltages V1 and V2. The second input node of amp1 is conductively coupled to the drain node of a MOSFET M1, which provides a voltage V1'. The second input node of amp2 is conductively coupled to the drain node of a MOSFET M2, which provides a voltage V2'. The amplifiers amp1 and amp2 are configured in feedback loops that operate to minimize the difference between input voltages V1 and V1' and between input voltages V2 and V2', respectively.

Current flow generators I1 and I2 are also conductively connected to the drain nodes of MOSFETs M1 and M2 respectively. A third amplifier amp3 has inputs conductively coupled to the drain node of MOSFET M3 and the drain node of MOSFET M4. The output of amplifier amp3 is conductively coupled to a MOSFET M9, which operates in the saturation region. An input current generator Iin is conductively coupled to the drain node of the MOSFET M3 and also the input of amplifier amp3. The Output current is received from the drain node of MOSFET M9, which has its Source node conductively coupled to the drain node of M4 and the other input to amplifier amp3. According to aspects of the present disclosure Iin is a temperature and VGS dependent input current and Tout is the temperature and VGS compensated output current. V1 and V2 are chosen such that M1, M2, M3, and M4 operate in the Deep Triode Region. It should be noted that M1, M2, M3, and M4 are chosen to have good matching characteristics. In particular, matching between MOSFETs M1 and M3 and between M2 and M4 are particularly important. For better matching MOSFETS M1, M2, M3, M4 must be placed symmetrically and layout to minimize the effects of process variation.

Additionally, amp1, amp2 and amp3 are chosen to have a very small input offset voltage, e.g., less than about 2 mV for a MOSFET that operates at VDS=100 mV. This is desirable in implementations where there is to be less than 2% error in the current information determined from the sensed MOSFET current Isen. Thus, with the circuit configured as discussed above the following equivalencies may be made:

$$Ron1 = \frac{V1'}{I1} = \frac{V1}{I1} \qquad \text{EQ. 4}$$

$$Ron2 = \frac{V2'}{I2} = \frac{V2}{I2} \qquad \text{EQ. 5}$$

$$V3 = Ron3 \cdot Iin = Ron1 \cdot Iin = \frac{V1}{I1} \cdot Iin \qquad \text{EQ. 6}$$

$$V4 = Ron4 \cdot Iout = Ron2 \cdot Iout = \frac{V2}{I2} \cdot Iout \qquad \text{EQ. 7}$$

In the above equations, Ron1 is the resistance from drain to source across MOSFET M1 and Ron2 is the resistance from drain to source across MOSFET M2, Ron3 is the resistance from drain to source across MOSFET M3, and Ron4 is the resistance from drain to source across MOSFET M4.

Due to the closed-loop configuration with MOSFET M9 amplifier, amp3 operates as a transconductance amplifier with its input voltages, V3 and V4 are equivalent. Ideally, V3 and V4 are the same, but in practice there may be a small input offset voltage. Assuming that the offset voltage is sufficiently small that it can be ignored, the following equivalence may be derived:

$$Iout = \frac{V1}{V2} \cdot \frac{I2}{I1} \cdot Iin \qquad \text{EQ. 8}$$

From this equivalence, a compensation circuit can be created with the circuit shown in FIG. 2. To establish compensation V1 and V2 are set to be dependent on VGS with a linear VGS Coefficient (VC1) and I1 and I2 depend on temperature with linear Temperature Coefficient (TC1). By way of example and not by way limitation voltages and currents may be applied to the compensation circuit 200 V1 and V2 are set such that V1=$V_{0\_VGS}$ and V2=$V_{0\_VGS}$*(1−VC1*ΔVGS) and I1 and I2 are set such that I1=$I_{0\_temp}$*(1+TC1*ΔT) and I2=$I_{0\_temp}$. Here, $V_{0\_VGS}$ represents a reference voltage that is the same as VDD, which may be, e.g., 5 volts DC, though in principle it could be any other voltage level according to the application and power MOSFET involved. The current $I_{0\_temp}$ represents a reference current at some reference temperature $T_0$, e.g., 25° C. or any other suitable temperature depending on the application. With these values set, the following relationship may be derived from EQ. 8:

$$Iout = Iin \cdot \frac{V_{0\_VGS}}{V_{0\_VGS} \cdot (1 - VC1 \cdot \Delta VGS)} \cdot \frac{I_{0\_temp}}{I_{0\_temp} \cdot (1 + TC1 \cdot \Delta T)} \qquad \text{EQ. 9}$$

$$= Iin \cdot \frac{1}{(1 + TC1 \cdot \Delta T) \cdot (1 - VC1 \cdot \Delta VGS)} \qquad \text{EQ. 10}$$

$$= \frac{1}{(1 + TC1 \cdot \Delta T - VC1 \cdot \Delta VGS - TC1 \cdot \Delta T \cdot VC1 \cdot \Delta VGS)} \qquad \text{EQ. 11}$$

$$\approx Iin \cdot \frac{1}{(1 + TC1 \cdot \Delta T - VC1 \cdot \Delta VGS)} \qquad \text{EQ. 12}$$

In the above equations, ΔVGS=VGS−$V_{0\_VGS}$ and ΔT=T−$T_0$. As discussed above Iin is dependent upon power MOSFET temperature and VGS. Thus, the input current Iin may be considered the input current at the reference voltage $V_{0\_VGS}$ and the reference temperature $T_0$ modified by a VGS-dependent term and temperature dependent term. Where the reference voltage and reference temperature are for example and without limitation, 5 volts and 25° C., the input current Iin may be expressed as:

$$Iin = I_{in0\_25\,C,5\,V}(1 + TC1 \cdot \Delta T - VC1 \cdot \Delta VGS) \qquad \text{EQ. 13}$$

The compensated current flowing from Iout is thus created:

$$Iout = Iin \cdot \frac{1}{(1 + TC1 \cdot \Delta T - VC1 \cdot \Delta VGS)} \qquad \text{EQ. 14}$$

$$= I_{in0\_25C,5V} \cdot \frac{(1 + TC1 \cdot \Delta T - VC1 \cdot \Delta VGS)}{(1 + TC1 \cdot \Delta T - VC1 \cdot \Delta VGS)} \qquad \text{EQ. 15}$$

$$= I_{in0\_25C,5V}$$

As shown in EQ. 15 when at the reference temperature and VGS, Iout is simply equal to Iin.

Figure 3A:
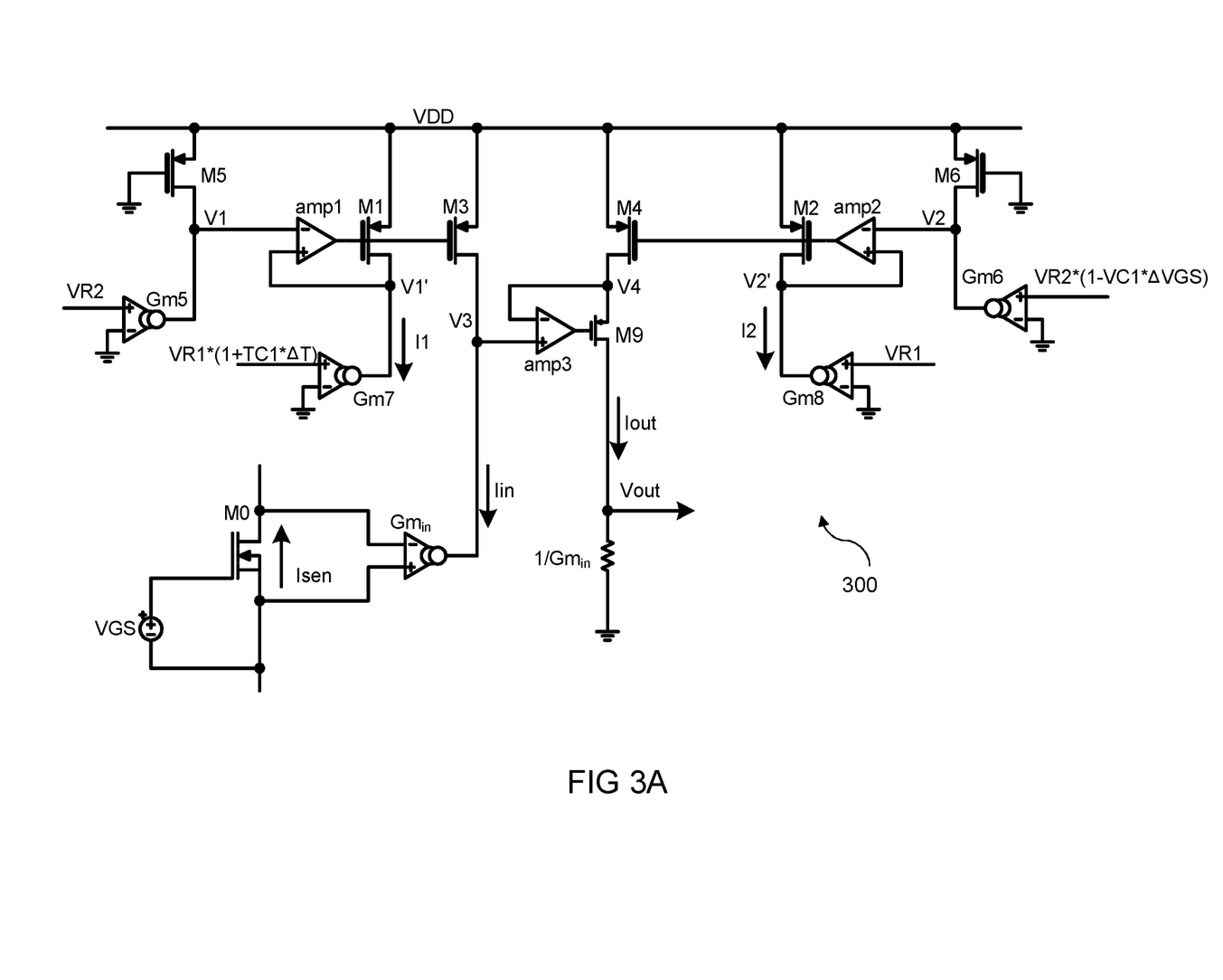
FIG. 3A is a detailed circuit diagram of the compensation device utilizing PMOSFETS according to aspects of the present disclosure.
Figure 3B:
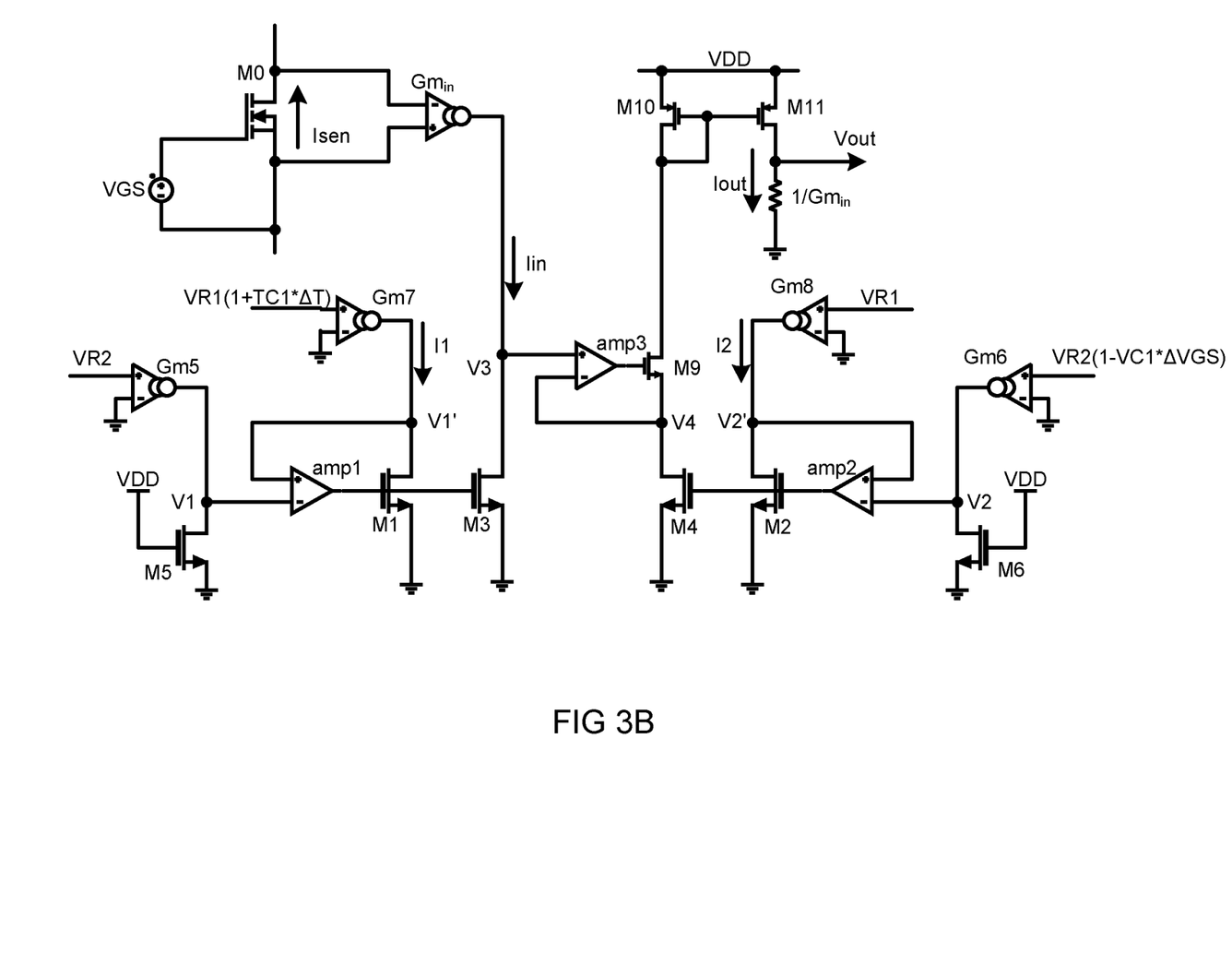
FIG. 3B is a Complimentary detailed circuit diagram of the compensation device utilizing NMOSFETS according to aspects of the present disclosure

There are a number of different ways in which the reference voltages and currents described above may be generated. FIGS. 3A-3B illustrate one way using transconductance amplifier to generate a reference voltage and current and temperature and voltage compensating reference voltages and currents. Specifically, FIG. 3A and FIG. 3B respectively illustrate detailed examples of PMOSFET and NMOSFET implementations of voltage compensation circuits for use with a power MOSFET $M_0$ where the current generators are implemented using trans-conductance amplifiers. In the PMOSFET implementation shown in FIG. 3A the body regions of the PMOSFETS are connected to VDD and in NMOSFET implementation shown in FIG. 3B, all the body regions of the NMOSFETS are connected to GND. In both implementations, a trans-conductance amplifier, $Gm_{in}$, generates Iin. As shown, the non-inverting input of $Gm_{in}$ is conductively coupled to the source node of the Power MOSFET M0 and the inverting input of $Gm_{in}$ is conductively coupled to the drain of the Power MOSFET M0. This creates a sense circuit that produces a voltage $V_{sense}$ across the power MOSFET M0. The trans-conductance amplifier $Gm_{in}$ produces or sinks current in proportion to the difference between the non-inverting input and the inverting input. When arranged as shown, the circuit compensates for changes in the on resistance $R_{dson}$ of the power MOSFET M0 by varying the input current Iin.

$$Iin = Gm_{in} \cdot Isen \cdot Rdson(T, VGS) \qquad \text{EQ. 16}$$

As discussed above the $R_{dson}$ of MOSFET M0 is dependent upon a function of VGS and temperature. Thus, $R_{dson}$ can be expressed as a reference value $Ron_0$ at a reference voltage and temperature as modified by temperature and VGS dependent terms. It should be assumed for simplicity that the temperature-dependent term is independent of the voltage-dependent term and vice versa.

$$Rdson(T, VGS) = Ron_0 \cdot (1 + TC1 \cdot \Delta T - VC1 \cdot \Delta VGS) \qquad \text{EQ. 17}$$

$$Iin = Gm_{in} \cdot Isen \cdot Ron_0 \cdot (1 + TC1 \cdot \Delta T - VC1 \cdot \Delta VGS) \qquad \text{EQ. 18}$$

Additionally, in FIG. 3A and FIG. 3B the trans-conductance amplifiers Gm5 and Gm6 are selected such that the trans-conductance (Gm) of the amplifiers is equivalent (Gm5=Gm6). Similarly, MOSFETS M5 and M6 are selected such that the on-resistance of MOSFET M5 (Ron5) and the on-resistance of MOSFET M6 (Ron6) are equivalent (Ron5=Ron6). Thus, the voltages V1 and V2 in the model shown in FIG. 2A and FIG. 2B are related by the following equivalences in the detailed system of FIG. 3:

$$V1 = Gm5 \cdot VR2 \cdot Ron5 \qquad \text{EQ. 19}$$

$$V2 = Gm6 \cdot VR2 \cdot (1 \cdot VC1 \cdot \Delta VGS) \cdot Ron6 \qquad \text{EQ. 20}$$

$$V2 = V1 \cdot (1 - VC1 \cdot \Delta VGS) \qquad \text{EQ. 21}$$

Where VR2 is a reference voltage, EQ. 19, 20, and 21 shows the equivalents that comprise VGS compensation portion of the compensation device 300. The temperature compensation portion of the compensation device 300 uses I1 and I2 in the simplified circuit 200 of FIG. 2A and FIG. 2B and are generated in the detailed system of FIG. 3A and FIG. 3B using specially selected trans-conductance amplifiers and MOSFETS. The trans-conductance amplifiers Gm7 and Gm8 are chosen such that their trans-conductance (Gm) is equivalent (Gm7=Gm8). The MOSFETs M1 and M2 are selected such that the on-resistance of MOSFET M1 (Ron1) and the on-resistance of MOSFET M3 (Ron3) are equivalent (Ron1=Ron3). Similarly, MOSFETs M2 and M4 are selected such that the on-resistance of MOSFET M2 (Ron2) and the on-resistance of MOSFET M4 (Ron4) are equivalent (Ron2=Ron4). The temperature-dependent reference voltage (VR1*(1+TC1*ΔT)) may be generated by any reference voltage circuit known in the art for example and without limitation a proportional to ambient temperature (PTAT) reference voltage circuit, which may include a temperature sensor that senses a temperature of the power MOSFET M0. Persons skilled in the art of analog electronic circuits will be able to design a suitable variable reference voltage circuit to generate the voltage-dependent reference voltage VR2*(1−VC1*ΔVGS) if the power MOSFET's VGS coefficient VC1 is known.

There are many kinds of PTAT circuits. By way of example, and not by way of limitation, a simple PTAT voltage circuit may include bandgap voltage reference (VBG) circuit and a VBE multiplier circuit. If the power MOSFET's temperature coefficient is known as its TC1 analog designer can generate the same TC1 with VR1. The VBG reference circuit is characterized by a constant TC1 and the VBE multiplier is characterized by a negative TC1, e.g., around −2 mV/° C. As is known to those skilled in the electronic circuit arts, a bandgap voltage reference (VBG) circuit is a temperature independent voltage reference circuit that produces a fixed (constant) voltage regardless of power supply variations, temperature changes and circuit loading from a device. VBG circuits base on silicon transistors commonly have an output voltage around 1.25 V, which is close to the theoretical 1.22 eV (0.195 aJ) band gap of silicon at 0 K. Those skilled in the electronic circuit arts will likewise be familiar with a VBE multiplier circuit, also known as a rubber diode or VBE multiplier, which uses a bipolar junction transistor circuit that serves as a voltage reference.

The following equivalences may be derived:

$$V1' = Gm7 \cdot VR1 \cdot (1 + TC1 \cdot \Delta T) \cdot Ron1 \qquad \text{EQ. 22}$$

$$V2' = Gm8 \cdot VR1 \cdot Ron2 \qquad \text{EQ. 23}$$

$$V1' = V2' \cdot (1 + TC1 \cdot \Delta T) \qquad \text{EQ. 24}$$

Amp1 and amp2 are chosen and arranged and operated in a closed loop configuration so that voltage V1 is equivalent to V1' (V1=V1') and V2 is equivalent to V2' (V2=V2').

MOSFETS M1 and M3 operate in the deep triode region and as such the Rdson of M1 (Ron1) and the Rdson of M3 (Ron3) are equivalent (Ron1=Ron3). Similarly, MOSFETS M2 and M4 operate in the deep triode region and as such the Rdson of M2 (Ron2) and the Rdson of M4 (Ron4) are equivalent (Ron2=Ron4). Additionally, MOSFETS M1, M2, M3 and M4 are specifically chosen such that these relationships are maintained during operation in the deep triode region. The relationship between Ron1 and Ron3, and Ron2 and Ron4 can be derived as follows:

$$Ron1 = Ron3 = \frac{V1}{Gm7 \cdot VR1 \cdot (1 + TC1 \cdot \Delta T)} = \frac{Gm5 \cdot VR2}{Gm7 \cdot VR1 \cdot (1 + TC1 \cdot \Delta T)} \qquad \text{EQ. 25}$$

$$Ron2 = Ron4 = \frac{V2}{Gm8 \cdot VR1} = \frac{Gm6 \cdot VR2 \cdot (1 - VC1 \cdot \Delta VGS)}{Gm8 \cdot VR1} \qquad \text{EQ. 26}$$

Voltage V3 is dependent upon Ron3 and Iin and voltage V4 depends on Ron4 and Iout. Substituting Ron3 with the equivalence expression on the right-hand side of EQ. 25 and similarly substituting Ron4 with the equivalence expression on the right-hand side of EQ. 26 results in:

$$V3 = Ron3 \cdot Iin = Iin \cdot \frac{Gm5 \cdot VR2}{Gm7 \cdot VR1(1 + TC1 \cdot \Delta T)} \qquad \text{EQ. 27}$$

$$V4 = Ron4 \cdot Iout = Iout \cdot \frac{Gm6 \cdot VR2 \cdot (1 - VC1 \cdot \Delta VGS)}{Gm8 \cdot VR1} \qquad \text{EQ. 28}$$

Further, V3 and V4 are connected by amp3, which is configured in a closed-loop arrangement with MOSFET M9 such that V3 and V4 are equivalent during operation (V3=V4). Additionally as discussed above Gm5=Gm6 and Gm7=Gm8. Using EQ. 27 and EQ. 28 the relationship between Iin and Iout is:

$$Iout = Iin \cdot \frac{Ron3}{Ron4} \qquad \text{EQ. 29}$$

$$= Iin \cdot \frac{Gm5 \cdot VR2}{Gm7 \cdot VR1 \cdot (1 + TC1 \cdot \Delta T)} \cdot \frac{Gm8 \cdot VR1}{Gm6 \cdot VR2 \cdot (1 - VC1 \cdot \Delta VGS)} \qquad \text{EQ. 30}$$

$$= Iin \cdot \frac{1}{(1 + TC1 \cdot \Delta T) \cdot (1 - VC1 \cdot \Delta VGS)} \qquad \text{EQ. 31}$$

EQ. 31 shows that the compensated current Iout is the input sink current Iin divided by the product of a voltage dependent term (1−VC1*ΔVGS) and a Temperature dependent term (1+TC1*ΔT). The compensated current Iout may be related to compensation for the Rdson of power MOSFET M0 through the use of the trans-conductance amplifier $Gm_{in}$ and creates the relationship shown. Inserting EQ. 18 for the input sink current Iin created by the trans-conductance amplifier $Gm_{in}$ into EQ. 31:

$$Iout = Gm_{in} \cdot Isen \cdot Ron_0 \cdot \frac{(1 + TC1 \cdot \Delta T - VC1 \cdot \Delta VGS)}{(1 + TC1 \cdot \Delta T) \cdot (1 - VC1 \cdot \Delta VGS)} \qquad \text{EQ. 32}$$

$$\simeq Gm_{in} \cdot Isen \cdot Ron_0 \cdot \frac{(1 + TC1 \cdot \Delta T - VC1 \cdot \Delta VGS)}{(1 + TC1 \cdot \Delta T - VC1 \cdot \Delta VGS)} = \quad \text{EQ. 33}$$
$$Gm_{in} \cdot Isen \cdot Ron_0$$

As shown in EQ. 33 at reference temperature and VGS this circuit will deliver an output current Iout proportional to the voltage drop across MOSFET M0 $Vds_{M0}$=Isen*$Ron_0$. At non-reference temperatures and VGS, $R_{dson}$ will vary and EQ. 32 shows that this variance will be compensated for in Iout according to aspects of the present disclosure.

Function Verification

From EQ. 32 and EQ. 33, operation of the device to compensate for Temperature or VGS variation in Rdson may be understood in terms of the equations shown below:

$$Iout_{\Delta T=0} = \quad \text{EQ. 34}$$
$$Gm_{in} \cdot Isen \cdot Rdson_0 \cdot \frac{(1 - VC1 \cdot \Delta VGS)}{(1 - VC1 \cdot \Delta VGS)} = Gm_{in} \cdot Isen \cdot Rdson_0$$

$$Iout_{\Delta VGS=0} = \quad \text{EQ. 35}$$
$$Gm_{in} \cdot Isen \cdot Rdson_0 \cdot \frac{(1 + TC1 \cdot \Delta T)}{(1 - TC1 \cdot \Delta T)} = Gm_{in} \cdot Isen \cdot Rdson_0$$

$$Iout_{\Delta T=\Delta VGS=0} = Gm_{in} \cdot Isen \cdot Rdson_0 \quad \text{EQ. 36}$$

Figure 4A:
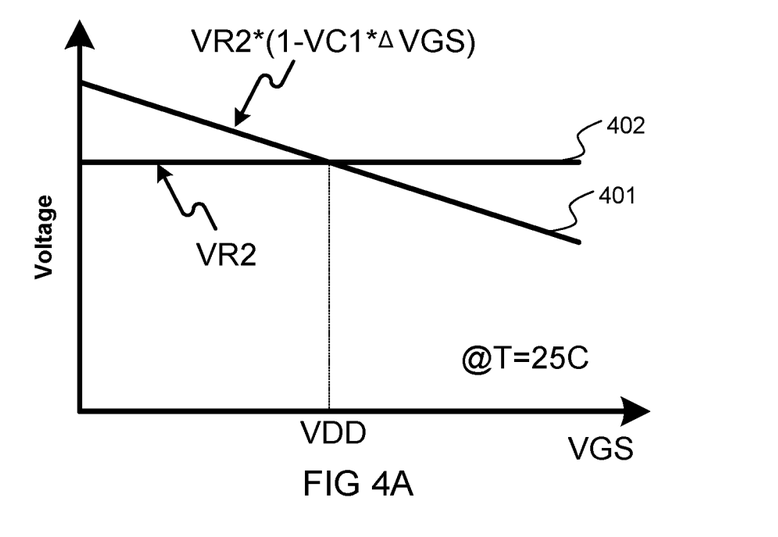
FIG. 4A is a line graph depicting the operation of the reference voltages in the compensation device with respect to VGS according to aspects of the present disclosure.
Figure 4B:
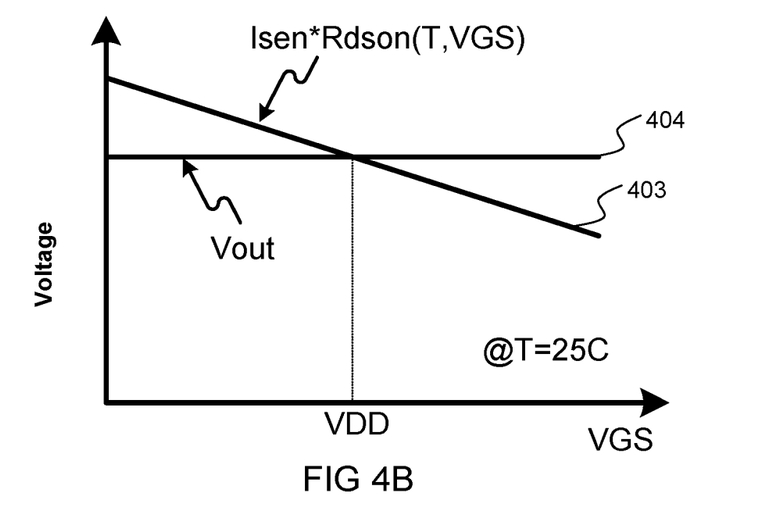
FIG. 4B is a line graph depicting the operation of the input voltage and output voltage in the compensation device with respect to VGS according to aspects of the present disclosure.

EQ. 34 shows that when the change in temperature at the power MOSFET is 0, the temperature dependent terms are negated leaving only Voltage dependent terms for compensation. FIG. 4A shows the relationship between the voltage coefficient modified reference voltage 401 and a reference voltage 402 during operation when the Temperature is held constant at 25 C. As shown the voltage coefficient modified reference voltage 401 varies inversely and proportionally with voltage while the reference voltage 402 remains constant. At the reference voltage, VDD, V1 and V2 intersect. FIG. 4B shows the relationship between Iin and Vout, when there is no temperature variation at the reference temperature, e.g., 25° C. Where Vout is derived through:

$$Vout = Iout \cdot \frac{1}{Gm_{in}} = Isen \cdot Ron_0 \cdot Gm_{in} \cdot \frac{1}{Gm_{in}} \quad \text{EQ. 37}$$
$$= Isen \cdot Ron_0$$

As shown in FIG. 4, as VGS increases the voltage across the MOSFET M0 403 decreases while the output voltage of the compensation device Vout 404 remains stable and constant despite variation in Rdson. Additionally, as shown Vout 404 the input voltage 403 intersect at the reference voltage VDD thus conforming to EQ. 36.

Figure 5A:
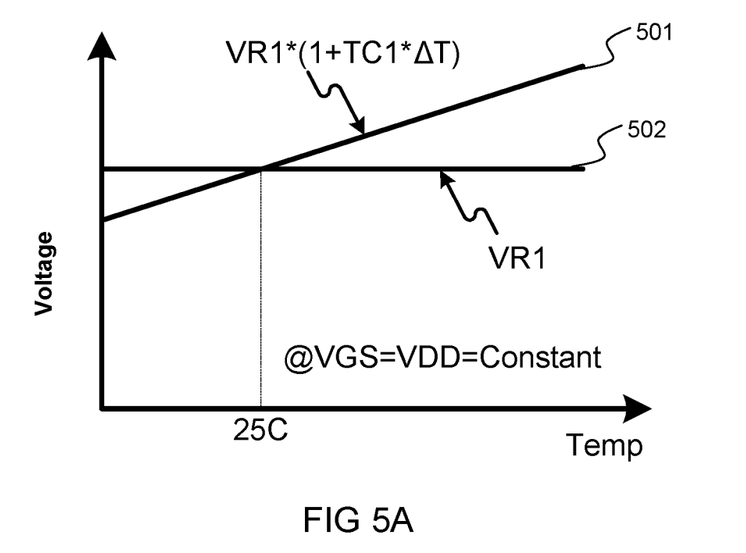
FIG. 5A is a line graph depicting the operation of the reference voltages in the compensation device with respect to temperature according to aspects of the present disclosure.
Figure 5B:
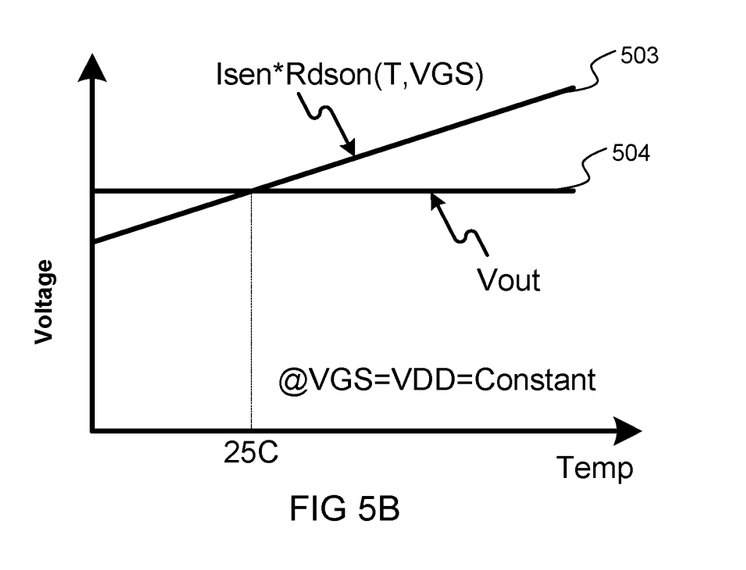
FIG. 5B is a line graph depicting the operation of the input voltage and output voltage in the compensation device with respect to temperature according to aspects of the present disclosure.

Similarly, EQ. 35 shows that when the change in VGS is 0 all of the voltage coefficient terms are negated leaving only temperature compensation. FIG. 5A shows the relationship between the temperature dependent voltage 501 and a reference voltage 502 during operation when the voltage VDD is held constant, e.g., at 5 volts. As shown the reference voltage 501 varies linearly with temperature while the reference voltage 502 remains constant. At a reference temperature, e.g., 25° C., the temperature dependent voltage 501 and reference voltage 502 intersect thus conforming to EQ. 36. FIG. 5B shows operation of compensation for temperature change with Vout 504 when VDD is constant. As shown when the temperature increases the input voltage Vin 503 varies linearly to the temperature while the 504 remains stable and constant. At the reference temperature, Vin 503 and Vout 504 intersect meaning Rdson=$Ron_0$ and thus the operation conforms to EQ. 36.

Finally, EQ. 36 shows that when both the change in temperature and the change in VGS are 0 the output current is simply proportional to the voltage drop across the MOSFET M0 (Isen*$Rdson_0$) at the reference temperature and VGS. The graphs shown in FIGS. 4A, 4B, 5A, and 5B show that when both temperature and VGS are held at the reference points Vout-Isen*$Ron_0$.

As may be seen from the above, temperature and VGS compensation of Rdson may be implemented with analog circuitry, which may be made adjustable to account for variations in temperature coefficient TC and VGS coefficient VC1 for different MOSFETs. This obviates the need for a look-up table and microcontroller.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the items following the article, except where expressly stated otherwise. The appended claims are not to be interpreted as including means-plus-function limitations, unless such a limitation is explicitly recited in a given claim using the phrase "means for."

What is claimed is:

1. A power MOSFET drain-source on resistance (Rdson) compensation device comprising:
    analog circuitry configured to receive an input signal proportional to a voltage drop across a power MOSFET, one or more base reference, a voltage-dependent reference, and a temperature-dependent reference, wherein the analog circuitry of the compensation circuit is configured to produce an output current corresponding to the input signal with compensation for gate-source voltage (VGS) and temperature variation of a drain-source on resistance of the power MOSFET wherein the temperature-dependent reference corresponds to a first base reference voltage plus a temperature coefficient for the power MOSFET Rdson multiplied by a change in a temperature and the voltage-dependent reference corresponds to a second base reference voltage minus a VGS voltage coefficient for the power MOSFET Rdson multiplied by a change in a gate-source voltage of the power MOSFET.

2. The power MOSFET Rdson compensation device of claim 1 wherein the input signal is a current proportional to the voltage drop across the power MOSFET.

3. The power MOSFET Rdson compensation device of claim 2 wherein the input signal is produced by a first trans-conductance amplifier having a first input coupled to a source of the power MOSFET and a second input coupled to a drain of the power MOSFET.

4. The power MOSFET Rdson compensation device of claim 1, wherein the input signal with VGS voltage coefficient and temperature coefficient compensation is a current proportional to the voltage drop across the power MOSFET divided by VGS voltage coefficient terms and temperature coefficient compensation terms.

5. A power MOSFET drain-source on resistance (Rdson) compensation device comprising:

analog circuitry configured to receive an input signal proportional to a voltage drop across a power MOSFET, one or more base reference, a voltage-dependent reference, and a temperature-dependent reference, wherein the analog circuitry of the compensation circuit is configured to produce an output current corresponding to the input signal with compensation for gate-source voltage (VGS) and temperature variation of a drain-source on resistance of the power MOSFET wherein the analog circuitry includes first, second, third and fourth MOSFETs, wherein each of the first, second, third and fourth MOSFETs operate in a deep triode region.

6. The power MOSFET Rdson compensation device of claim 5 wherein the analog circuitry includes first, second and third amplifiers, wherein an output of the first amplifier is conductively coupled to a gate of the first MOSFET and a gate of the third MOSFET, wherein an output of the second amplifier is conductively coupled to a gate of the second MOSFET and a gate of the fourth MOSFET, and wherein a first input of the third amplifier is conductively coupled to a drain of the third MOSFET and a second input of the third amplifier is conductively coupled to a drain of the fourth MOSFET.

7. The power MOSFET Rdson compensation device of claim 5, wherein a drain of first MOSFET is coupled to a temperature dependent reference current and a drain of the second MOSFET is coupled to a reference current that is proportional to one of the one or more reference voltages and the temperature-dependent reference current is proportional to the temperature-dependent reference voltage.

8. The power MOSFET Rdson compensation device of claim 7, wherein the reference current is from an output node of a second trans-conductive amplifier and the temperature-dependent reference current is from an output node of a third trans-conductance amplifier, wherein an input node of the third trans-conductance amplifier is conductively coupled to the temperature-dependent reference voltage.

9. The power MOSFET Rdson compensation device of claim 6 wherein a first input node of the first amplifier is conductively coupled one of the one or more reference voltages and a second input node of the first amplifier is conductively coupled to a drain of the first MOSFET and wherein the first input node of the second amplifier is conductively coupled to the voltage-dependent reference voltage and a second input node of the second amplifier is conductively coupled to a drain of the second MOSFET.

10. The power MOSFET Rdson compensation device of claim 6 wherein the drain of the fourth MOSFET is conductively coupled to a source of the fifth MOSFET operating in a saturation region and the output current is flows from a drain of the fifth MOSFET.

* * * * *